United States Patent [19]

Ohshita

[11] Patent Number: 5,789,321

[45] Date of Patent: Aug. 4, 1998

[54] METHOD FOR FORMING A BARRIER METAL LAYER MADE OF TITANIUM NITRIDE ON A SILICON SUBSTRATE

[75] Inventor: Yoshio Ohshita, Tokyo, Japan

[73] Assignee: NEC Corporation, Tokyo, Japan

[21] Appl. No.: 879,039

[22] Filed: Jun. 19, 1997

Related U.S. Application Data

[63] Continuation of Ser. No. 571,416, Dec. 13, 1995, abandoned.

[30] Foreign Application Priority Data

Dec. 14, 1994 [JP] Japan .................... 6-333055

[51] Int. Cl.$^6$ .................... H01L 21/44
[52] U.S. Cl. .................... 438/680; 438/653; 438/627; 438/629; 438/656; 438/660; 438/685
[58] Field of Search .................... 438/653, 627, 438/629, 656, 660, 685, 680

[56] References Cited

U.S. PATENT DOCUMENTS

| | | | |
|---|---|---|---|
| 4,022,872 | 5/1977 | Carson et al. | 423/297 |
| 4,987,102 | 1/1991 | Nguyen et al. | 437/238 |
| 5,002,646 | 3/1991 | Egerton et al. | 204/177 |
| 5,271,963 | 12/1993 | Eichman et al. | 427/248.1 |
| 5,348,587 | 9/1994 | Eichman et al. | 118/723 MP |
| 5,508,881 | 4/1996 | Stevens | 361/305 |
| 5,525,543 | 6/1996 | Chen | 437/192 |
| 5,567,243 | 10/1996 | Foster et al. | 118/730 |
| 5,567,483 | 10/1996 | Foster et al. | 427/535 |
| 5,591,483 | 1/1997 | Winter et al. | 427/248.1 |
| 5,593,511 | 1/1997 | Foster et al. | 148/238 |
| 5,616,518 | 4/1997 | Foo et al. | 438/680 |
| 5,665,640 | 9/1997 | Foster et al. | 438/680 |

Primary Examiner—Charles L. Bowers, Jr.
Assistant Examiner—Lynne A. Gurley
Attorney, Agent, or Firm—Young & Thompson

[57] ABSTRACT

A low pressure chloride chemical vapor deposition method for depositing a titanium nitride film within a contact hole formed in an insulation film overlying a silicon substrate is carried out by reacting a nitrogen source gas in plasma state, which contains gas molecules decomposed or excited, with a titanium source gas in non-plasma state, which contains titanium chloride undecomposed so that the titanium nitride film has a good step coverage and a low concentration of residual chlorine.

9 Claims, 1 Drawing Sheet

METHOD FOR FORMING A BARRIER METAL LAYER MADE OF TITANIUM NITRIDE ON A SILICON SUBSTRATE

This application is a continuation of application Ser. No. 08/571,416, filed Dec. 13, 1995, now abandoned.

BACKGROUND OF THE INVENTION

The present invention relates to a method for forming a barrier metal layer made of titanium nitride on a silicon substrate, and more particularly to a method for forming a barrier metal layer made of titanium nitride in a contact hole in an insulation film overlying a silicon substrate.

Aluminum or other metals are usable for interconnections provided in LSI circuits. The aluminum interconnections are formed using a heat treatment. Normally, the silicon substrate is covered by an insulation layer having contact holes. The interconnections are provided over the insulation layer on the silicon substrate. The interconnections are so provided as to be in contact with the silicon substrate via the contact holes formed in the insulation layer.

If the aluminum interconnections are provided not only over the insulation layer but also in the contact holes so that the aluminum interconnections are in contact with the silicon substrate, the heat treatment required to form them may cause a reaction between aluminum and silicon, thereby resulting in a destruction of the contact between the aluminum interconnections and the silicon substrate. This can be the case when the interconnections are made of metals, such as tungsten W, other than aluminum.

In order to avoid the above problem, it is effective to provide a titanium nitride film between the metal interconnections, such as aluminum interconnections, and the silicon substrate since a high temperature heat treatment at 900° C. for forming the interconnections can not cause a reaction between titanium nitride and silicon. The silicon substrate is doped with an impurity such as phosphorus and boron. The titanium nitride film can prevent the impurity to be diffused into the metal interconnections such as aluminum interconnections. The titanium nitride film can further prevent aluminum atoms in the interconnections to be diffused into the silicon substrate.

In the prior art, the titanium nitride barrier film is formed in the contact hole by a reactive sputtering method using a titanium target and an argon gas mixed with a nitrogen gas.

As the scaling down of the semiconductor device is progressed, the diameter of the contact hole is also reduced, for example, to 0.5 micrometers or less while the depth of the contact hole remains unchanged. For this reason, a ratio of the depth of the contact hole to the diameter thereof namely an aspect ratio becomes large. The large aspect ratio can raise a problem in deterioration of a step coverage. Therefore, no titanium nitride film may be deposited on the bottom of the contact hole, in other word on the silicon substrate, while the titanium nitride film is deposited on the side walls of the contact hole. As a result, no contact between the interconnections and the silicon substrate via the contact hole is obtained.

In order to avoid this problem, a collimated sputtering method is available. However, the collimated sputtering method has a limitation for the aspect ratio of the contact hole when used to deposit the titanium nitride film in the contact hole.

Alternatively, the titanium nitride film may be deposited by a chemical vapor deposition. The chemical vapor deposition method is divided into two types; one is a metal organic chemical vapor deposition method using titanium source gas; and the second is a chloride deposition method using chloride. Normally, the chloride deposition method can provide a good step coverage rather than the metal organic chemical vapor deposition method. For example, $TiCl_4$ and $NH_3$ may be used as Ti source gas and nitrogen source gas respectively to cause thermal decompositions of the source gases and the reductions thereof on the silicon substrate so that a good step coverage of the titanium nitride film is obtained.

The above chloride deposition method using the $TiCl_4$ and $NH_3$ gas system has a problem with residual chlorine in the titanium nitride film. Particularly when the titanium nitride film is deposited under the good step coverage conditions, several ten percentages of chlorine tends to reside in the titanium nitride film.

In contrast, when the titanium nitride film is deposited under the condition of a low concentration of chlorine, the step coverage of the titanium nitride film is deteriorated. As a result, no titanium nitride film is deposited on the bottom of the contact hole with the large aspect ratio.

Accordingly, if the residual chlorine concentration in the titanium nitride film is reduced, then it is difficult to obtain the good step coverage of the titanium nitride film. by contrast, if the titanium nitride film is deposited under the good step coverage conditions, then it is difficult to reduce the residual chlorine concentration in the titanium nitride film. Therefore, it is difficult to satisfy both the requirements for reduction in the residual chlorine concentration in the titanium nitride film and obtaining the good step coverage thereof. The causes of this difficulty are as follows.

When the titanium nitride film is deposited by the chloride deposition method using the $TiCl_4$ and $NH_3$ source gases under the condition for obtaining the good step coverage, both $TiCl_4$ and a compound of $TiCl_4$ with $NH_3$ contribute to the growth of the titanium nitride film. However, these $TiCl_4$ and a compound of $TiCl_4$ with $NH_3$ have low reactivities to titanium nitride. For this reason, once a monoatomic layer of titanium nitride is deposited on the silicon substrate, $TiCl_4$ and $NH_3$ tend to no longer adhere on the titanium nitride monoatomic layer. Thus, the good step coverage of the titanium nitride film is obtained.

However, the above deposition method has the following problem. Normally, $NH_3$ shows a thermal stability, for which reason, a growth pressure is reduced so that $TiCl_4$ can play a role as a main source for growth of the titanium nitride film. Otherwise, a growth temperature is dropped so that the decomposition of $NH_3$ is suppressed to prevent nitrogen source gas to be efficiently deposited. This causes the problems with a lowered growth rate of the titanium nitride and a residual chlorine in the titanium nitride layer. The residual chlorine in the titanium nitride film causes the corrosion of the material for the interconnections such as aluminum, thereby resulting in deteriorations of the properties of the device and in lowering of the reliability. It is, therefore, required to satisfy the requirements not only for the reduction in the concentration of the residual chlorine but also for obtaining the good step coverage.

SUMMARY OF THE INVENTION

Accordingly, it is an object of the present invention to provide a novel method for forming a titanium nitride film on a silicon substrate, free from the foregoing problems.

It is a further object of the present invention to provide a novel method for forming a titanium nitride film with a good

3 step coverage in a contact hole with a large aspect ratio formed in an insulation film overlying a silicon substrate.

It is still a further object of the present invention to provide a novel method for forming a titanium nitride film with a reduced concentration of a residual chlorine in a contact hole with a large aspect ratio formed in an insulation film overlying a silicon substrate.

The above and other objects, features and advantages of the present invention will be apparent from the following descriptions.

The present invention provides a chemical vapor deposition method for depositing a titanium nitride film on silicon by reacting, on heated silicon, a nitrogen source gas in plasma state, which contains gas molecules decomposed or excited, with a titanium source gas in non-plasma state, which contains undecomposed gas molecules.

The present invention also provides a low pressure chloride chemical vapor deposition method for depositing a titanium nitride film within a contact hole formed in an insulation film overlying a silicon substrate by reacting a nitrogen source gas in plasma state, which contains gas molecules decomposed or excited, with a titanium source gas in non-plasma state, which contains undecomposed titanium chloride so that the titanium nitride film has a good step coverage and a low concentration of residual chlorine.

BRIEF DESCRIPTIONS OF THE DRAWINGS

Preferred embodiments of the present invention will be described by reference to the accompanying drawings.

DISCLOSURE OF THE INVENTION

Figure 1:
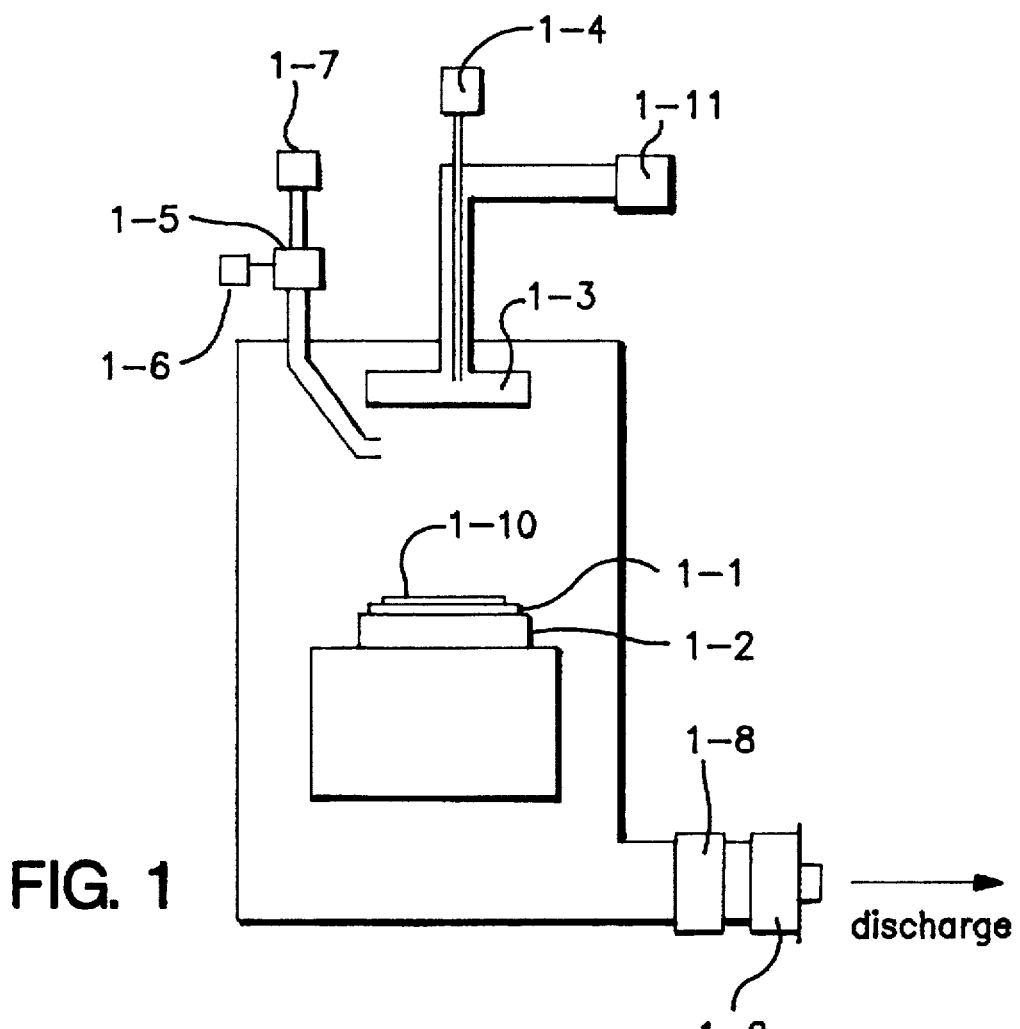
FIG. 1 is a diagram illustrative of an apparatus for depositing titanium nitride film in first and second embodiments according to the present invention.

The present invention provides a chemical vapor deposition method for depositing a titanium nitride film on silicon by reacting, on heated silicon, a nitrogen source gas in plasma state, which contains gas molecules decomposed or excited, with a titanium source gas in non-plasma state, which contains undecomposed gas molecules.

It is preferable that the titanium source gas is $TiCl_4$. It is also preferable that the nitrogen source gas comprises at least one selected from the group consisting of $NH_3$, $N_2$, and $N_2H_4$. The silicon is heated at for example 500° C. The reaction may be carried out under a pressure of 20 Pa. A flow rate of the nitrogen source gas may be set ten times of a flow rate of the titanium source gas.

An additional nitrogen source gas in non-plasma state, which contains undecomposed gas molecules, may optionally be supplied on the silicon during the reaction. The additional nitrogen source gas in non-plasma state is the same as the nitrogen source gas in plasma state. In this case, the reaction is carried out under a pressure of 30 Pa. In this case, a flow rate of the additional nitrogen source gas in non-plasma state is set at three times the flow rate of the nitrogen source gas in plasma state.

The present invention also provides a low pressure chloride chemical vapor deposition method for depositing a titanium nitride film within a contact hole formed in an insulation film overlying a silicon substrate by reacting a

4 nitrogen source gas in plasma state, which contains gas molecules decomposed or excited, with a titanium source gas in non-plasma state, which contains titanium chloride undecomposed so that the titanium nitride film has a good step coverage and a low concentration of residual chlorine.

It is preferable that the titanium source gas is $TiCl_4$. It is also preferable that the nitrogen source gas comprises at least one selected from the group consisting of $NH_3$, $N_2$, and $N_2H_4$. The silicon substrate is heated at for example 500° C. The reaction may be carried out under a pressure of 20 Pa. A flow rate of the nitrogen source gas may be set at ten times the flow rate of the titanium source gas.

An additional nitrogen source gas in non-plasma state, which contains undecomposed gas molecules, may optionally be supplied on the silicon during the reaction. The additional nitrogen source gas in non-plasma state is the same as the nitrogen source gas in plasma state. In this case, the reaction is carried out under a pressure of 30 Pa. In this case, a flow rate of the additional nitrogen source gas in non-plasma state may be set at three times the flow rate of the nitrogen source gas in plasma state.

In contrast to the present invention, titanium nitride film deposited by the conventional chloride chemical vapor deposition method has a large amount of the residual chlorine. This is caused by the fact that a low growth temperature used for forming the semiconductor device does not allow nitrogen to sufficiently reduce and eliminate chlorine. When the titanium nitride film is deposited under the condition for obtaining the good step coverage, the compositions containing chlorine can serve as a main seed of the deposition, thereby resulting in the deposited titanium nitride film having a large amount of the residual chlorine.

On the other hand, in the present invention, on a surface of the heated silicon substrate, the Ti source gas is reacted with either nitrogen atoms or any of molecules, ion and radical which contain nitrogen transported from a plasma containing nitrogen, so as to deposit the titanium nitride film. Undecomposed $TiCl_4$ is adhered on the heated silicon substrate surface, thereby resulting in a formation of a monoatomic layer of $TiCl_4$. However, no more deposition of $TiCl_4$ is obtained. The nitrogen radical or nitrogen atoms generated from the plasma efficiently react with $TiCl_x$ on the deposition surface. As a result, Ti—Cl bonding is broken and in place Ti—N bonding is newly formed. This phenomenon is caused by the following facts. The nitrogen radical shows a high reactivity. TiN has a large standard formation enthalpy of approximately 80 Kcal/mol, while the bonding energy of Ti—Cl is approximately 26 Kcal/mol. Thus, TiN bonding is stable and is readily be formed. This reaction dissociates chlorine from Ti—Cl bonding, thereby eliminating chlorine from the growth surface. As a result, the amount of the residual chlorine in the titanium nitride film deposited is considerably reduced. As described above, $TiCl_4$ is adhered to form the mono-atomic layer thereby obtaining the condition for rate-determination of the growth rate by the surface reaction. Thus, the formation of the mono-atomic layer of $TiCl_4$ on the entirety of the deposition area is prior to the deposition of the layer. For this reason, a good step coverage of the titanium nitride film deposited is obtained.

As described above, according to the present invention, the undecomposed titanium chloride of low reactivity is reacted with the nitrogen radical of high reactivity on the heated substrate surface to deposit a titanium nitride film having a reduced amount of residual chlorine and a good step coverage.

EMBODIMENTS

A first embodiment according to the present invention will be described. FIG. 1 illustrates a low pressure chemical vapor deposition apparatus which comprises the following elements. A silicon substrate 1-10 is supported on a substrate supporting section 1-1 which is provided on a substrate heater 1-2. A first NH$_3$ gas supplying system 1-7 is provided for supplying NH$_3$ gas. The first NH$_3$ gas supplying system 1-7 is coupled to a plasma generator 1-5 for generating plasma of NH$_3$ gas. The plasma generator 1-5 is driven at a high frequency power supplied by a high frequency power source 1-6. A shower head 1-3 is provided for supplying TiCl$_4$ and NH$_3$ gases. The shower head 1-3 is coupled to both a TiCl$_4$ gas supplying system 1-4 for supplying TiCl$_4$ gas and a second NH$_3$ gas supplying system 1-11 for supplying NH$_3$ gas. A chamber is provided to accommodate the silicon substrate 1-10, the substrate supporting section 1-1, and the substrate heater 1-2, in addition the shower head 1-3. The chamber is provided with a pressure adjusting valve 1-8 and a gas discharge pump 1-9.

The substrate 1-10 is heated up to 500° C. The TiCl$_4$ gas supplying system 1-4 supplies TiCl$_4$ gas via the shower head 1-3 onto the substrate 1-10. The NH$_3$ gas is supplied via the plasma generator 1-5 in which the NH$_3$ gas is excited or decomposed to be subsequently supplied into the chamber. The chamber is maintained at a low pressure by the pressure adjusting valve 1-8 and the gas discharge pump 1-9.

Figure 2:
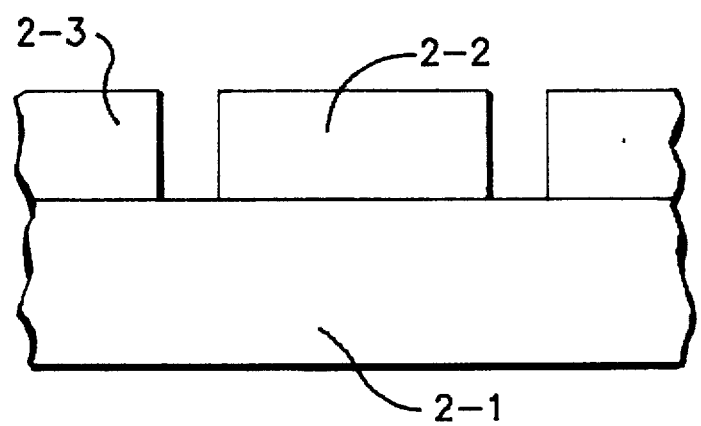
FIG. 2 is a fragmentary cross sectional elevation view illustrative of a substrate and an insulation film covering the same and having a contact hole within which a titanium nitride film is deposited as a barrier metal layer in first and second embodiments according to the present invention.

FIG. 2 illustrates the structure of the substrate 1-10. The substrate 1-10 comprises a silicon substrate 2-1 with a diameter of 2 inches and a silicon oxide film 2-2 covering the silicon substrate 2-1. The silicon oxide film 2-2 has a thickness of approximately 1micrometers. In the silicon oxide film 2-2, contact holes 2-3 with a diameter of 0.2 micrometers are formed by using photo-lithography and dry etching.

An internal pressure of the chamber is set at 20 Pa. The high frequency power source 1-6 is set to supply a radio frequency power at 150 W. An NH$_3$ gas flow rate is set at 100 sccm, while a TiCl$_4$ gas flow rate is set at 10 sccm. A substrate temperature is set at 500° C. Via the shower head 1-3, the TiCl$_4$ gas only is supplied. In addition, the NH$_3$ plasma gas is also supplied so as to cause the reaction between the TiCl$_4$ gas and the NH$_3$ plasma gas on the heated silicon substrate. Under the above conditions, the chemical vapor deposition is carried out for 10 minutes.

The concentration of the residual chlorine in the titanium nitride film is measured by a secondary ion mass spectrometry to confirm that the concentration is in the order of 1×10$^{18}$ cm$^{-3}$. It is also confirmed that the step coverage of the titanium nitride film in the contact hole is approximately 0.8, provided that the step coverage is defined as a ratio of a thickness of the titanium nitride film at the bottom of the contact hole to a thickness thereof at an upper portion of the side walls of the contact hole.

As a comparative example, the TiCl$_4$ gas and the NH$_3$ gas are supplied via the shower head 1-3 only, without NH$_3$ gas excited or decomposed by the high frequency power. The substrate temperature is set at 500° C. The concentration of the residual chlorine in the titanium nitride film is measured by a secondary ion mass spectrometry to confirm that the concentration is in the order of 1×10$^{21}$ cm$^{-3}$.

The above experimental facts demonstrate that by use of the novel method according to the present invention it is possible to obtain both the reduced concentration of the residual chlorine and the good step coverage.

Whereas in this embodiment, NH$_3$ plasma gas is supplied onto the substrate, N$_2$ plasma gas, N$_2$H$_4$ plasma gas or mixture thereof are also available to obtain the same effect.

A second embodiment according to the present invention will be described with reference to FIGS. 1 and 2 again. The low pressure chemical vapor deposition apparatus is the same as that of the first embodiment. A silicon substrate 1-10 is supported on a substrate supporting section 1-1 which is provided on a substrate heater 1-2. A first NH$_3$ gas supplying system 1-7 is provided for supplying NH$_3$ gas. The first NH$_3$ gas supplying system 1-7 is coupled to a plasma generator 1-5 for generating plasma of NH$_3$ gas. The plasma generator 1-5 is driven at a high frequency power supplied by a high frequency power source 1-6. A shower head 1-3 is provided for supplying TiCl$_4$ gases and NH$_3$ gases. The shower head 1-3 is coupled to both a TiCl$_4$ gas supplying system 1-4 for supplying TiCl$_4$ gas and a second NH$_3$ gas supplying system 1-11 for supplying NH$_3$ gas. A chamber is provided to accommodate the silicon substrate 1-10, the substrate supporting section 1-1, and the substrate heater 1-2, in addition the shower head 1-3. The chamber is provided with a pressure adjusting valve 1-8 and a gas discharge pump 1-9.

The substrate 1-10 is heated up to 500° C. The TiCl$_4$ gas supplying system 1-4 supplies TiCl$_4$ gas via the shower head 1-3 onto the substrate 1-10. The NH$_3$ gas is supplied via the plasma generator 1-5 in which the NH$_3$ gas is excited or decomposed to be subsequently supplied into the chamber. The chamber is maintained at a low pressure by the pressure adjusting valve 1-8 and the gas discharge pump 1-9.

An internal pressure of the chamber is set at 30 Pa The high frequency power source 1-6 is set to supply a radio frequency power at 150 W. In the plasma generator 1-5, an NH$_3$ gas flow rate is set at 100 sccm. Via the shower head 1-3, the NH$_3$ gas is supplied at a flow rate of 300 sccm, while a TiCl$_4$ gas flow rate is set at 10 sccm. A substrate temperature is set at 500° C. Via the shower head 1-3, both the TiCl$_4$ gas and the NH$_3$ gas are supplied. Further, the NH$_3$ plasma gas is supplied so as to cause the reaction between the plasma NH$_3$ gas and the TiCl$_4$ gas on the heated silicon substrate. Under these conditions, the chemical vapor deposition is carried out for 10 minutes.

The concentration of the residual chlorine in the titanium nitride film is measured by a secondary ion mass spectrometry to confirm that the concentration is two times the concentration of the first embodiment. However, the growth rate of the titanium nitride film is three times of the growth rate of the first embodiment. It is also confirmed that the step coverage of the titanium nitride film in the contact hole is approximately 0.75, provided that the step coverage is defined as a ratio of a thickness of the titanium nitride film at the bottom of the contact hole to a thickness thereof at an upper portion of the side walls of the contact hole.

As a comparative example, the TiCl$_4$ gas and the NH$_3$ gas are supplied via the shower head 1-3 only, without NH$_3$ plasma gas including excited or decomposed NH$_3$ by the high frequency power. The substrate temperature is set at 500° C. The concentration of the residual chlorine in the titanium nitride film is measured by a secondary ion mass spectrometry to confirm that the concentration is in the order of 1×10$^{21}$ cm$^{-3}$.

The above experimental facts demonstrate that by use of the novel method according to the present invention it is possible to obtain both the reduced concentration of the residual chlorine and the good step coverage.

Whereas in this embodiment, NH$_3$ plasma gas is supplied onto the substrate, N$_2$ plasma gas, N$_2$H$_4$ plasma gas or a mixture thereof are also available to obtain the same effect.

Whereas modifications of the present invention will be apparent to a person having ordinary skill in the art, to which the invention pertains, it is to be understood that embodiments shown and described by way of illustrations are by no means intended to be considered in a limiting sense. Accordingly, it is to be intended to cover by claims all modifications which fall within the spirit and scope of the present invention.

What is claimed is:

1. A method of depositing a titanium nitride film on exposed silicon in a semiconductor device comprising the steps of:

heating the exposed silicon on which the titanium nitride film is to be deposited; and reacting on the heated silicon (A) a nitrogen source gas which is the primary source of reactant nitrogen for the titanium nitride film, the nitrogen source gas being in a plasma state, and (B) a titanium source gas which is the primary source of the reactant titanium for the titanium nitride film, the titanium source gas being in a non-plasma state, reacting said source gas (A) and said source gas (B) on the heated silicon in the presence of (C) a nitrogen gas in a non-plasma state which is not a source of reactant nitrogen for the titanium nitride film at a pressure of 30 Pa, and a flow rate of said gas (C) is three times a flow rate of said source gas (B), whereby the nitrogen source gas and the titanium source gas react to form the titanium nitride film on the heated silicon.

2. The method of claim 1, wherein said source gas (A) comprises a gas selected from the group consisting of $NH_3$, $N_2$, and $N_2H_4$.

3. The method of claim 1, wherein said source gas (B) is $TiCl_4$.

4. The method of claim 1, wherein said gas (C) comprises a gas selected from the group consisting of $NH_3$, $N_2$, and $N_2H_4$.

5. the method of claim 4, wherein said gas (C) is the same as said source gas (A).

6. A method of depositing a thin titanium nitride film with a low concentration of residual chlorine on exposed silicon substrate at a bottom of a contact hole in a semiconductor device comprising the steps of:

heating the exposed silicon substrate on which the titanium nitride film is to be deposited; and introducing into a chamber containing the heated silicon substrate (A) a high reactivity, decomposed, nitrogen source gas selected from the group consisting of $NH_3$, $N_2$, and $N_2H_4$ which is the primary source of reactant nitrogen for the titanium nitride film, the nitrogen source gas being in a plasma state, and (B) a low reactivity, undecomposed, $TiCl_4$ source gas which is the primary source of the reactant titanium for the titanium nitride film, the $TiCl_4$ source gas being in a non-plasma state, reacting said source gas (A) and said source gas (B) on the heated silicon in the presence of (C) a nitrogen gas in a non-plasma state which is not a source of reactant nitrogen for the titanium nitride film at a pressure of 30 Pa, and a flow rate of said gas (C) is three times a flow rate of said source gas (B), whereby said source gas (A) and said source gas (B) react to form a monatomic titanium nitride film on the exposed silicon at the bottom of the contact hole with a low concentration of residual chlorine in the film.

7. The method of claims, wherein the contact hole has a diameter of about 0.5 micrometers.

8. The method of claim 6, wherein said gas (C) comprises a gas selected from the group consisting of $NH_3$, $N_2$, and $N_2H_4$.

9. The method of claim 8, wherein said gas (C) is the same as said source gas (A).

* * * * *